United States Patent [19]

Miyazaki

[11] Patent Number: 5,353,794
[45] Date of Patent: Oct. 11, 1994

[54] MAGNETIC RESONANCE IMAGING METHOD AND SYSTEM CAPABLE OF MEASURING SHORT "T2" SIGNAL COMPONENTS

[75] Inventor: Mitsue Miyazaki, Tochigiken, Japan

[73] Assignee: Kabushiki Kaisha Toshiba, Kawasaki, Japan

[21] Appl. No.: 927,808

[22] Filed: Aug. 10, 1992

[30] Foreign Application Priority Data

Aug. 12, 1991 [JP] Japan .................. 3-201880

[51] Int. Cl.$^5$ ............................ A61B 5/055
[52] U.S. Cl. .................. 128/653.2; 324/307; 324/309
[58] Field of Search ............... 324/307, 309; 128/653.2

[56] References Cited

U.S. PATENT DOCUMENTS

| | | | |
|---|---|---|---|
| 4,471,306 | 9/1984 | Edelstein et al. | 324/309 |
| 4,628,262 | 12/1986 | Maudsley | 324/309 |
| 4,714,884 | 12/1987 | Glover . | |
| 4,740,748 | 4/1988 | Rzedzian . | |
| 4,769,602 | 9/1988 | Vinegar et al. . | |
| 4,982,160 | 1/1991 | Hagiwara | 324/307 |

FOREIGN PATENT DOCUMENTS 0098426  6/1983  European Pat. Off. .
0208483  6/1986  European Pat. Off. .

OTHER PUBLICATIONS

Magnetic Resonance in Medicine, vol. 14, No. 2, 1 May 1990, Duluth, Minn., pp. 415-422. A. A. Maudsley et al., "Spin Echo 31P Spectroscopic Imaging in the Human Brain".

*Primary Examiner*—Lee S. Cohen
*Assistant Examiner*—Brian L. Casler
*Attorney, Agent, or Firm*—Limbach & Limbach

[57] ABSTRACT

A novel spin echo method and system applies a slice-selecting gradient field to a biological body under medical examination located in a static field during which time a spin excitation pulse is also applied to the biological body. A refocusing pulse is applied to the biological body after the application of the slice-selecting gradient field. A rephasing gradient field having the same polarity as the slice-selecting gradient field is applied just after the application of the refocusing pulse. A spin echo signal induced in a slice of the biological body excited by the spin excitation pulse is acquired to obtain MR information of the excited slice. The method reduces echo time and minimizes loss in T2 signal component. A magnetic resonance imaging system for carrying out the method is also disclosed.

15 Claims, 9 Drawing Sheets

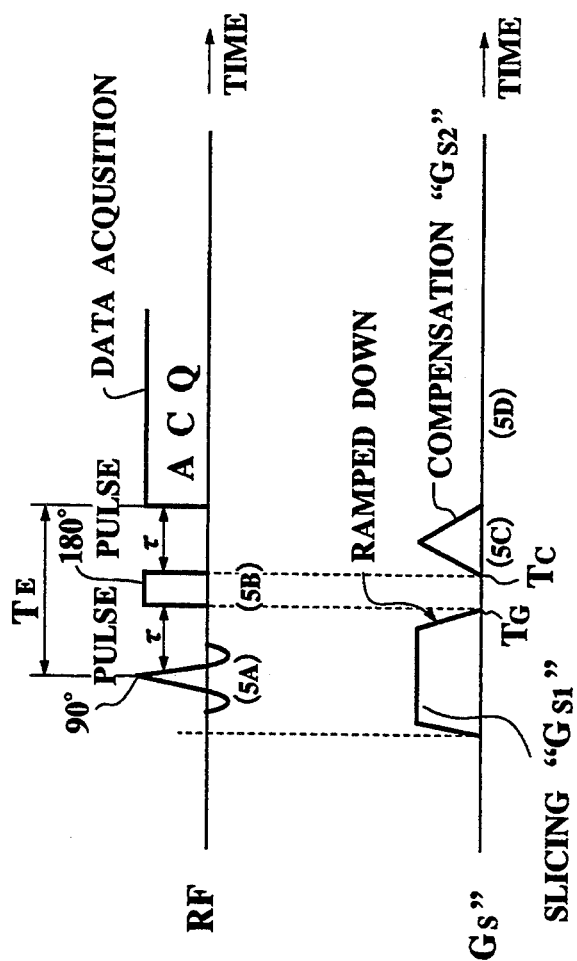
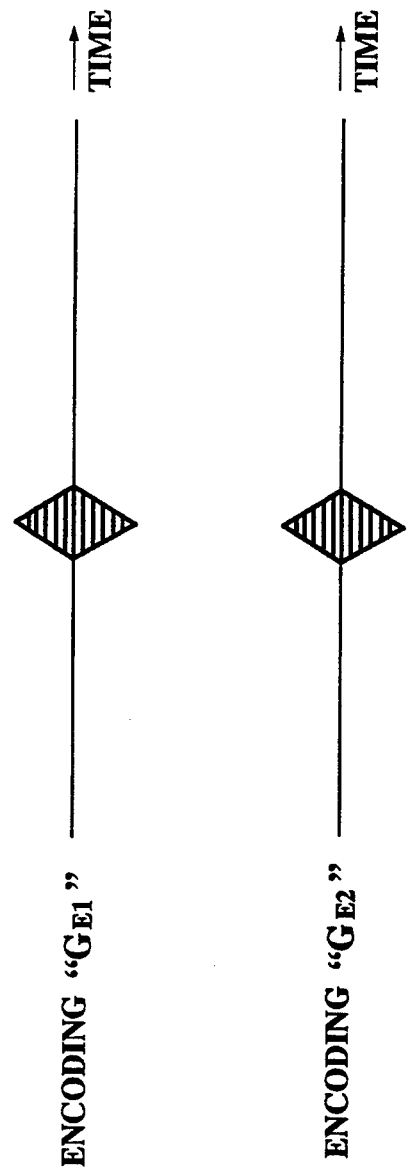
FIG.3A  FIG.3B  FIG.3C  FIG.3D

VOLUME OF INTEREST "VOI"

20

$\tau = 2$ msec
(TE=2$\tau$=4msec)

$\tau = 4$ msec
(TE=2$\tau$=8msec)

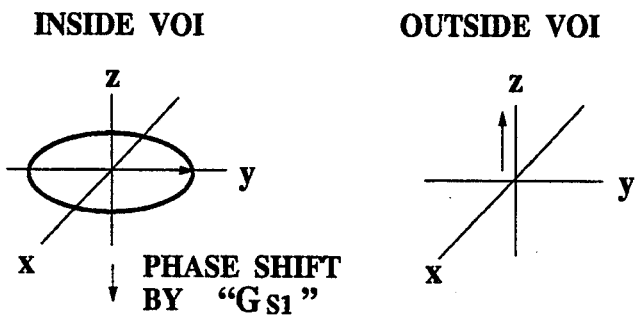
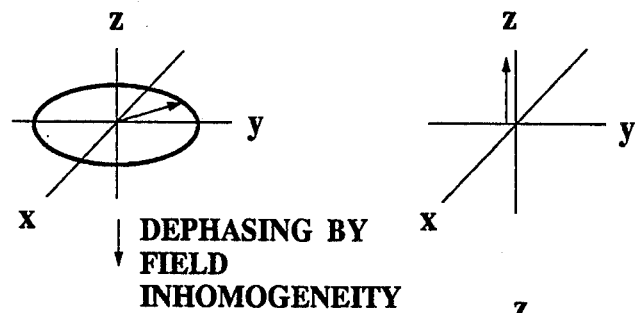
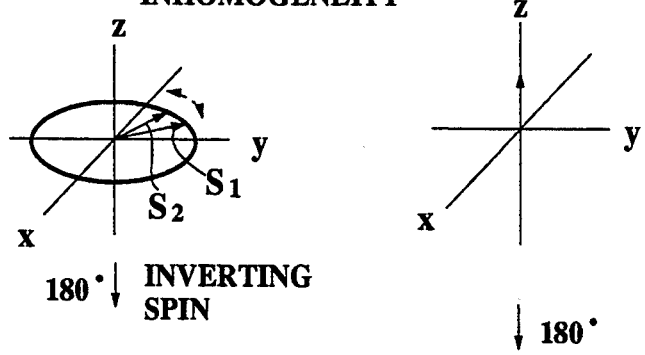
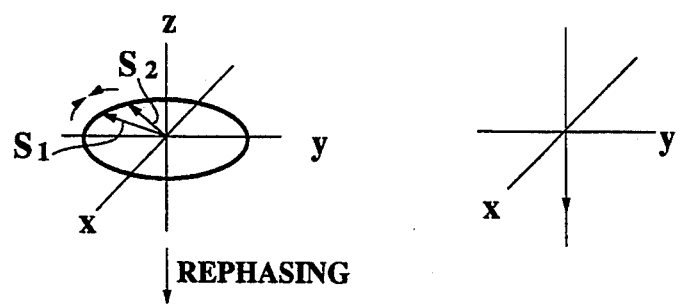
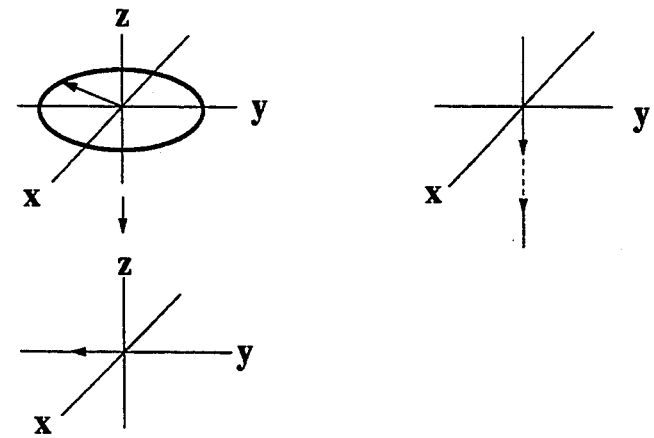

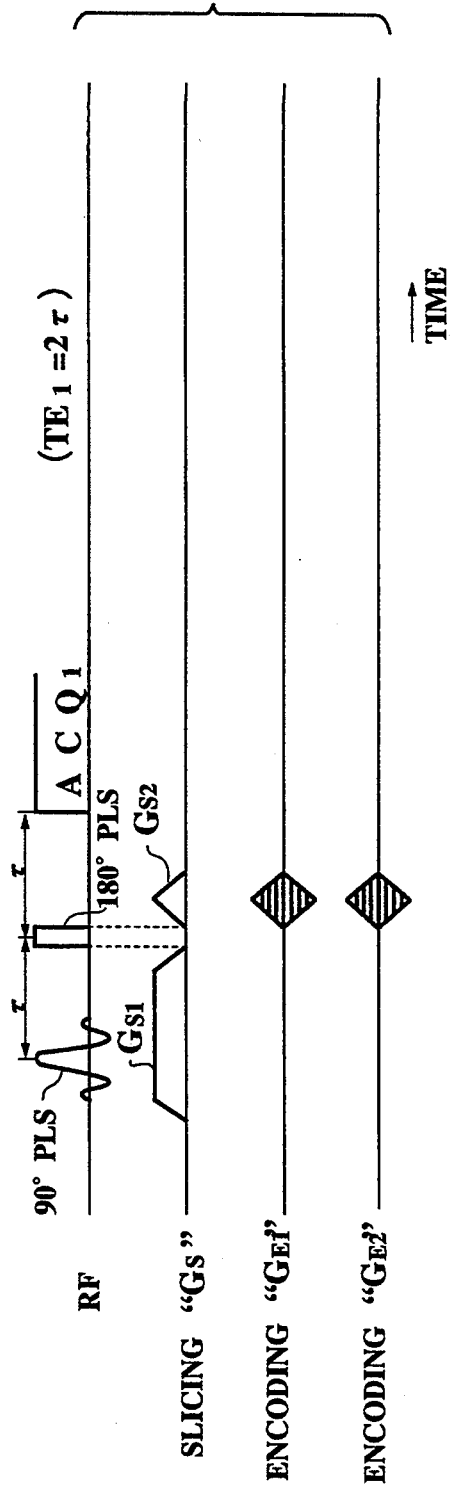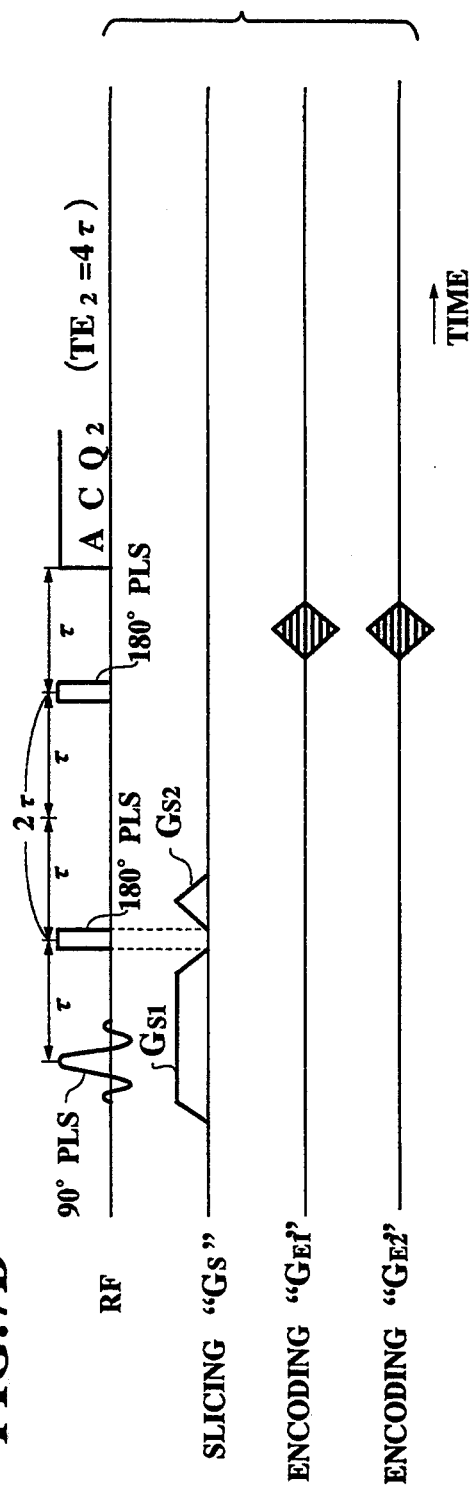

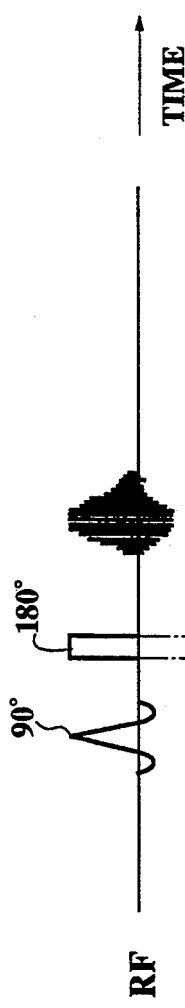
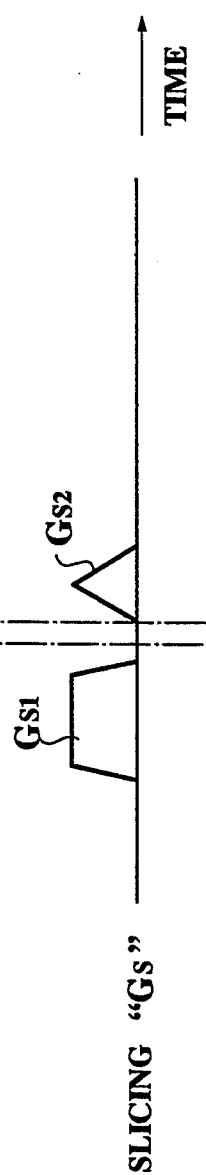
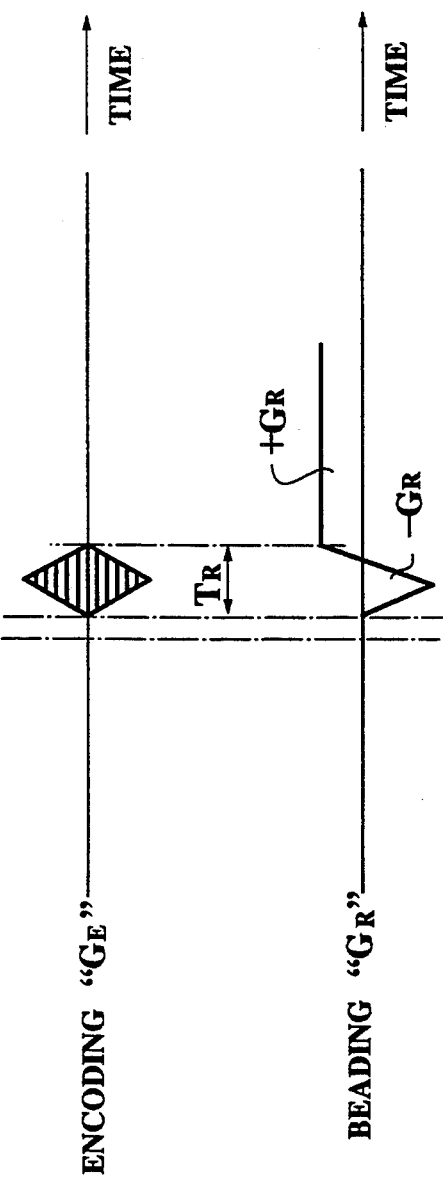
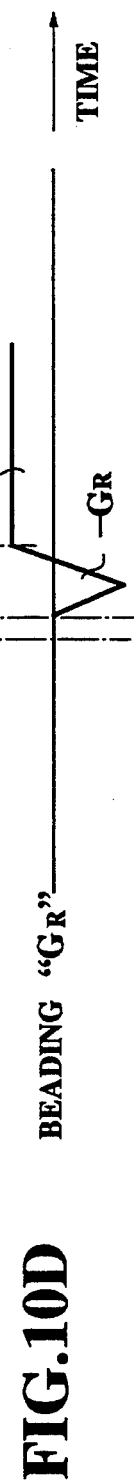
FIG.10A  RF
FIG.10B  SLICING "$G_S$"
FIG.10C  ENCODING "$G_E$"
FIG.10D  BEADING "$G_R$"

MAGNETIC RESONANCE IMAGING METHOD AND SYSTEM CAPABLE OF MEASURING SHORT "T2" SIGNAL COMPONENTS

BACKGROUND OF THE INVENTION

1. Field of the Invention

The present invention generally relates to a magnetic resonance imaging method and a magnetic resonance imaging system for producing a spectroscopic image and an MR (magnetic resonance) image of a biological body under medical examination, such as a brain of a patient. More specifically, the present invention is directed to a specific spin echo method and a system using this specific spin echo method capable of acquiring short "$T_2$" signal components contained in an MR signal.

2. Description of the Prior Art

In the conventional MR spectroscopic imaging (referred to an "MRSI"), there are provided typical two pulse sequences, namely the FID (free induction decay) method with utilizing the selective excitation, and the spin echo method. In accordance with the spectroscopic imaging by employing the known FID pulse sequence, one of the gradient fields along the orthogonal 3-axis directions is used as the slicing gradient field, whereas the remaining two fields are used as the phase-encoding gradient fields. Under such a gradient field relationship, the slicing gradient field is applied to a biological body under medical examination with an application of a selective 90° pulse, and then is ramped down and finally reaches a zero level. Furthermore, when the phase-encoding gradient fields are applied as same as when the slicing gradient field for the rephasing purpose is applied, and the application of the phase-encoding gradient fields is accomplished, the FID signal is acquired. In this FID method, a time period from a center of the selective excitation 90° pulse until the acquisition of the FID signal, namely the delay time is prolonged, during which the above-described applications of the various gradient fields are carried out. Accordingly, the resultant spectrum contains a baseline distortion. Furthermore, there is another problem in this FID method that the longer the delay time becomes, the more the FID signals of the short $T_2$-relaxation time are lost, or attenuated.

Also, in case of the spectroscopic imaging with use of the pulse sequence by the spin echo method, the following pulse sequence operation is carried out. That is, after a selective excitation 90° pulse has been applied to a biological body under medical examination and a half of echo time "$T_E$" (namely, $\frac{1}{2} T_E = \tau$) has elapsed, a non-selective 180° pulse is applied thereto, and thereafter spin echo signals from the biological body are acquired after another half of echo time "$T_E$" has elapsed. Although the relationship among the orthogonal 3-axis gradient fields of the spectroscopic imaging by this spin echo method is similar to that of the FID method, the spin echo signals are acquired just after $\frac{1}{2} T_E$ has elapsed since the non-selective excitation 180° pulse had been applied. In other words, the MR signal (spin echo signal) acquisition of the spin echo method starts earlier than the MR signal (FID signal) acquisition of the FID method. Moreover, in case of this spin echo method, since the dephasing phenomenon of the spin which happens to occur after the selective excitation 90° pulse due to the disturbance in uniformity of magnetic fields, can be rephased by the non-selective 180° pulse to acquire the spin echo signals, there is another merit that no baseline distortion is contained in the spin echo signal.

However, when the spectroscopic imaging is performed by utilizing the pulse sequence of the conventional spin echo method, since the selective excitation slicing gradient field is first applied to the biological body, and thereafter the dephased spins caused by this slicing gradient field are compensated by applying the non-selective excitation 180° pulse, the overall echo time "$T_E$" cannot be considerably shortened. Even if the application time duration of the selective excitation slicing gradient field would be shortened as much as possible, the overall echo time "$T_E$" could be more or less shortened. As a consequence, since the total echo time "$T_E$" is still long, the spin echo signals having short "$T_2$" (spin-to-spin relaxation) time would be lost, namely low S/N ratios. For example, generally speaking, $T_2$ of water is approximately 100 milliseconds, whereas $T_2$ of $\gamma$-ATP is about 10 to 15 microseconds, which could not be acquired at the practically acceptable signal level, or satisfied S/N ratio in the conventional spectroscopic imaging with employment of the pulse sequence of the conventional spin echo method.

SUMMARY OF THE INVENTION

The present invention has been made in an attempt to solve the above-described problems, and therefore, has an object to provide both of a novel MR imaging method and a novel MR imaging system capable of considerably shortening an echo time "$T_E$" by employing an improved spin echo pulse sequence.

Another object of the present invention is to provide a novel spectroscopic imaging method and also a novel spectroscopic imaging system capable of acquiring a spin echo signal having a very short "$T_2$" (spin-to-spin relaxation) time at a practically acceptable S/N ratio without any baseline distortion.

To achieve the above-described objects, a magnetic resonance imaging method, according to the present invention, comprises the steps of:

applying a slice-selecting gradient field ($G_{S1}$) to a biological body (20) under medical examination located in a static field;

applying a spin excitation pulse (90° pulse) to the biological body (20) while said slice-selecting gradient field ($G_{S1}$) is being applied thereto;

applying a refocusing pulse (180° pulse) to the biological body (20) after the application of said slice-selecting gradient field ($G_{S1}$);

applying to the biological body (20), a rephasing gradient field ($G_{S2}$) having the same polarity of that of said slice-selecting gradient field ($G_{S1}$) just after the application of said refocusing pulse (180° pulse); and acquiring a spin echo signal induced in a slice (VOI) of the biological body (20) excited by said spin excitation pulse (90° pulse) to obtain MR information of said excited slice (VOI).

Furthermore, according to another aspect of the present invention, a magnetic resonance imaging system (100) comprises:

first gradient field applying means (3) for applying a slice-selecting gradient field ($G_{S1}$) to a biological body (20) under medical examination located in a static field;

first pulse applying means (4) for applying a spin excitation pulse (90° pulse) to the biological body (20) while said slice-selecting gradient field ($G_{S1}$) is being applied thereto;

second pulse applying means (4) for applying a refocusing pulse (180° pulse) to the biological body (20) after the application of said slice-selecting gradient field ($G_{S1}$);

second gradient field applying means (3) for applying to the biological body (20), a rephasing gradient field ($G_{S2}$) having the same polarity of that of said slice-selecting gradient field ($G_{S1}$) just after the application of said refocusing pulse (180° pulse); and means (9:1) for receiving a spin echo signal induced in a slice (VOI) of the biological body (20) excited by said spin excitation pulse (90° pulse) to process MR information of said excited slice (VOI).

BRIEF DESCRIPTION OF THE DRAWINGS

For a better understanding of the present inventive method as well as system, reference is made of the following description in conjunction with the accompanying drawings, in which:

FIGS. 3A to 3D are timing charts for explaining a pulse sequence of a first specific spin echo method employed in the MR imaging system 100 used for spectroscopy imaging;

FIGS. 5A to 5D schematically illustrate transition of spin vectors in the specific spin echo method;

FIGS. 7A to 7C are timing charts for explaining a pulse sequence of a second specific spin echo method employed in the MR imaging system 100 used for spectroscopy imaging;

FIGS. 10A to 10D are timing charts for explaining a pulse sequence of a third specific spin echo method employed in the MR imaging system 100 used for MR imaging.

DETAILED DESCRIPTION OF THE PREFERRED EMBODIMENTS

Figure 1:
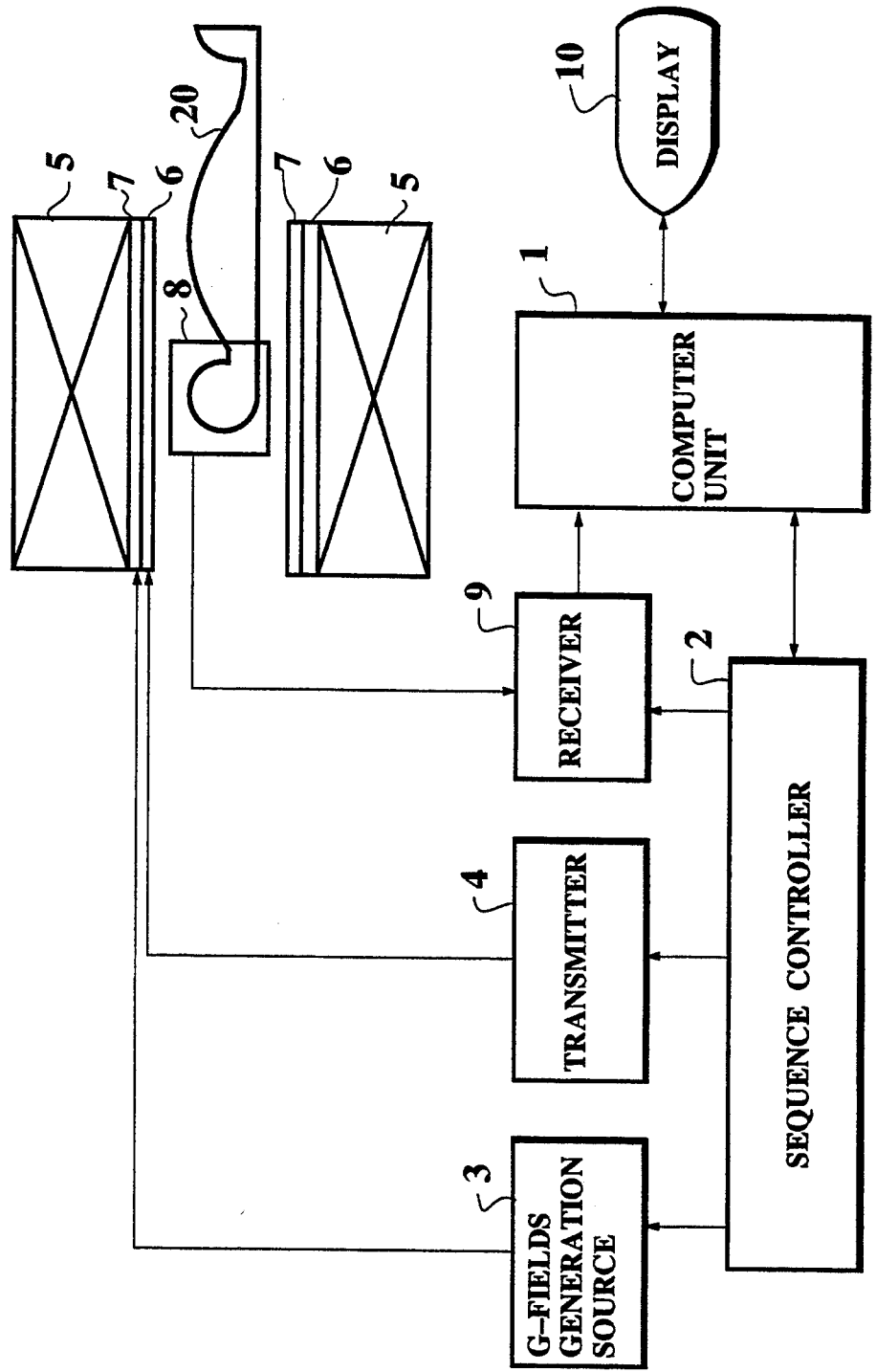
FIG. 1 is a conceptional diagram for an overall arrangement of an MR imaging system 100 according to a first preferred embodiment of the present invention.

Overall Arrangement of MR Imaging System with First Specific Spin Echo Method FIG. 1 schematically represents an overall arrangement of an MR (magnetic resonance) imaging system 100 with employment of a first specific spin echo method according to a first preferred embodiment of the present invention.

As shown in FIG. 1, the first MR imaging system 100 mainly comprises a computer unit 1, a sequence controller 2, a power source 3 for generating gradient fields, an RF pulse transmitter 4, an echo pulse receiver 9 and a display unit 10. Under control of this computer unit 1, the sequence controller 2 executes a predetermined sequence operation of various circuit arrangements. A biological body 20 under medical examination such as a patient is located within a static field generated by a main magnet unit 5. Both of a selective excitation 90° pulse and a non-selective excitation 180° pulse are applied from the transmitter 4 as an RF pulse via a transmitter coil 6 to the biological body 20 under control of the sequencer 2 (will be discussed in detail). Also, gradient fields in the orthogonal 3-axis directions (namely, X-axis, Y-axis and Z-axis) are applied from the power source 3 for generating gradient fields via a gradient coil 7 to the biological body 20 under control of the sequence controller 2.

An MR signal (spin echo signal) induced in the biological body 20, for instance, a brain of a patient is received by a receiver coil 8 and thereafter detected by the detector 9. Then, the detected spin echo signal is supplied to the computer unit 1 so as to acquire chemical shift information in case of spectroscopic imaging. Accordingly, a spectroscopic image is displayed on the display unit 10 based on this acquired chemical shift information. Furthermore, in case of MR imaging, an MR image is reconstructed from the detected spin echo signal in the computer unit 1 and displayed on the display unit 10.

Internal Arrangement of MR Imaging System

Figure 2:
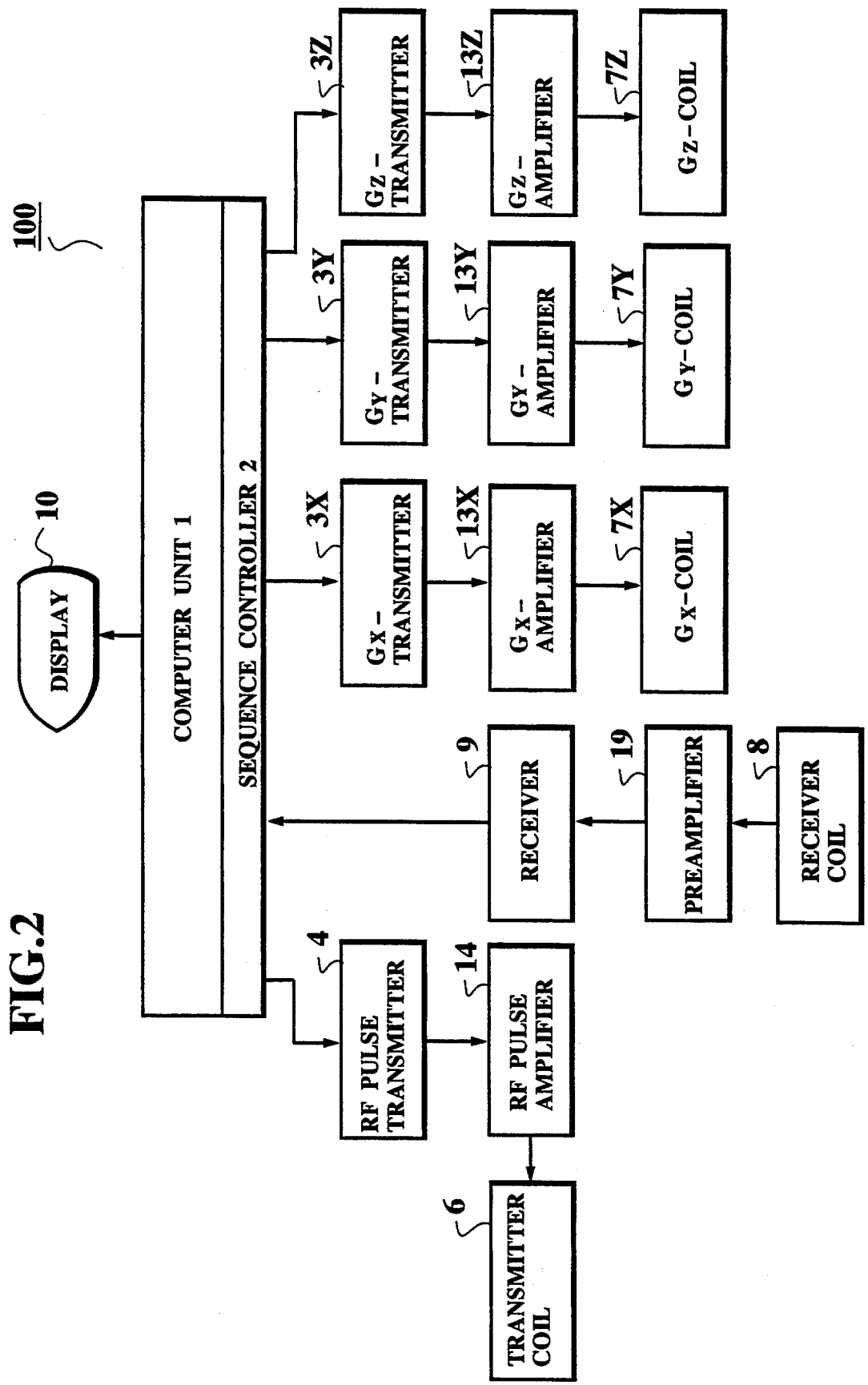
FIG. 2 is a schematic block diagram of the concrete circuit arrangement of this MR imaging system 100.

In FIG. 2, there is shown an internal arrangement of the above-described MR imaging system 100 of FIG. 1.

As represented in FIG. 2, and RF pulse amplifier 14 is connected between the RF pulse transmitter 4 and the transmitter coil 6 so as to amplify the RF pulses. A preamplifier 19 is connected between the receiver 9 and the receiver coil 8 in order to amplify the MR signals (spin echo signals) received from the receiver coil 8. Both of these RF pulse transmitter 4 and receiver 9 are controlled by the sequence controller 2 under control of the computer unit 1.

The above-described gradient field coil 7 is constructed of three orthogonal-field coils Gx-coil 7X, Gy-coil 7Y and Gz-coil 7Z, and similarly the power source 3 for generating gradient fields is arranged by three gradient-field transmitters 3X, 3Y, 3Z and three gradient-field amplifiers 13X, 13Y and 13Z. These gradient-field transmitters 3X, 3Y and 3Z are controlled by the sequence controller 2 under control of the computer unit 1.

First Specific Spin Echo Method

As previously explained, the MR imaging system 100 according to the first preferred embodiment of the present invention utilizes a first specific spin echo method. A pulse sequence of this specific spin echo method is represented in FIGS. 3A to 3D. Under control of the sequence controller 2 shown in FIGS. 1 and 2, the pulse sequence of the first specific spin echo method is executed as follows:

When a selective excitation 90° pulse of FIG. 3A is applied to the biological body 20 (see FIG. 1), a slicing gradient field "$G_{S1}$" is applied thereto (see FIG. 3B) under such a condition that a static field is being applied to this biological body 20 from the gradient field generating power source 3. Then, when this slicing gradient field "$G_{S1}$" is ramped down and thereafter reaches a zero level of the field strength at a time "$t_G$", a non-selective excitation 180° pulse is applied to the biological body 20 so as to refocus the spins (will be described in detail). Since the non-selective excitation 180° pulse is applied immediately after the application of the selective excitation 90° pulse has been applied and the strength of the slicing gradient field "$G_{S1}$" becomes zero, an entire echo time "$T_E$" can be considerably shortened as compared with the conventional echo time. That is, this entire echo time "$T_E$" of the first specific spin echo method is defined by ("$\tau$"+"$\tau$") as shown in FIG. 3A. Since such a shorter echo time "$T_E$" is realized, various spins having very short "$T_2$" times can be detected at practically acceptable signal levels. In other words, although such spins having very short "$T_2$" times could not be acquired in the conventional MR imaging system, they can be sufficiently acquired in the MR imaging system 100 according to the present invention by utilizing the first specific spin echo pulse sequence.

Also, according to time first specific spin echo method, another slicing gradient field "$G_{S2}$" having the same polarity as that of the first-mentioned slicing gradient field "$G_{S1}$" is applied to the biological body 20 just after the above-described non-selective excitation 180° pulse is applied, namely at a time "$t_C$" shown in FIG. 3B. As a result, the spins are rephased and the slicing gradient field "$G_{S1}$" applied during the selective excitation can be compensated by applying the slicing gradient field "$G_{S2}$".

In addition, if either a first encoding gradient field "$G_{E1}$", or a second encoding gradient field "$G_{E2}$", otherwise both of these first and second encoding gradient fields "$G_{E1}$" and "$G_{E2}$" are applied to the biological body 20 at the same time when the slicing gradient field "$G_{S2}$" for the compensation purpose is applied thereto, 3-D (dimensional) spectroscopy and 3-D CS (chemical shift) imaging may be performed during a data acquisition time period (see FIGS. 3A, 3C and 3D).

Data Acquisition for Chemical Shift Imaging

Figure 4:
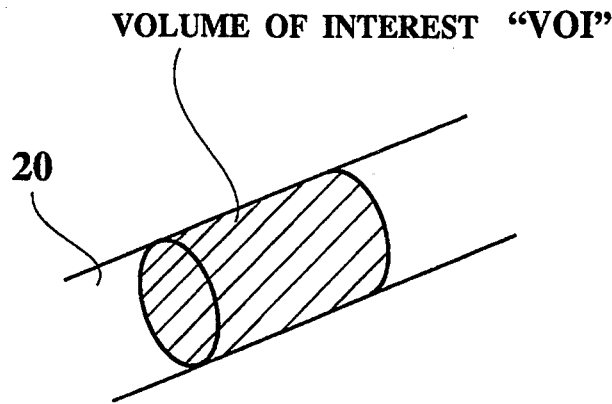
FIG. 4 is an illustration for a volume of interest "VOI" and a region outside this VOI.

Referring now to FIGS. 4 and 5, transition of spin vectors located within a volume of interest "VOI" and outside this "VOI" will be explained.

The spin vector behavior according to the first specific spin echo method is performed as follows:

When the selective excitation 90° pulse of FIG. 3A is applied to the spin of the biological body 20 (FIG. 5A$_1$), the phase shift caused by the slicing gradient field "$G_{S1}$" is produced in the condition of the spin as shown in FIG. 5A$_2$. Moreover, this spin condition of FIG. 5A$_2$ is changed into another spin condition of FIG. 5A$_3$ due to dephasing by the effects of field inhomogeneity within $\frac{1}{2}$ $T_E$ ($=\tau$). When the spin condition is brought into such a condition as shown in FIG. 5A$_3$, the non-selective excitation 180° pulse is applied to reverse the polarity of the spin as represented in FIG. 5B. Subsequently, when the next (compensating) slicing gradient field G$_{S2}$ is applied (see FIG. 3B), the spin condition of FIG. 5B is changed into another spin condition of FIG. 5C, namely the spins are rephased. Thereafter, the spin is refocused to induce the echo signals during the data acquisition period (see FIGS. 3B and 5D).

Generally speaking, as a result of the spin behaviour, the net vector value of the spin caused by the spin precession is reduced in accordance with the "$T_2$" relaxation time. Accordingly, as previously explained, since the total echo time "$T_E$" of the present invention is considerably shorter than that of the convention spin echo method, reduction of the net spin vector value is not so large, as compared with that of the conventional spin echo method.

This advantage of the present invention will now be visually explained with reference to FIGS. 6A and 6B.

Figure 6A:
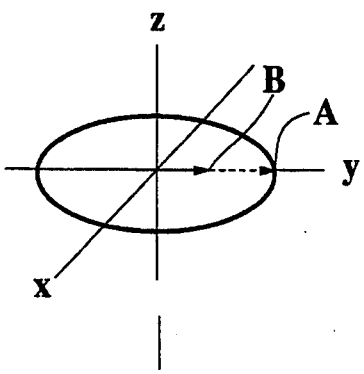
FIGS. 6A and 6B schematically represent attenuations of spin vectors according to both of the conventional and inventive spin echo methods.
Figure 6B:
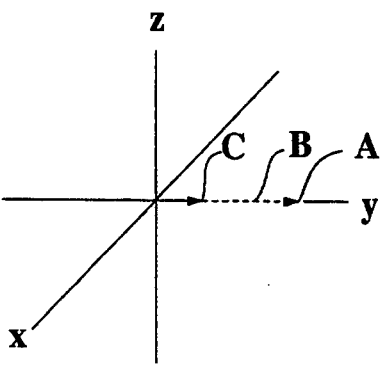

As illustrated in FIG. 6A, with regard to a spin having a constant relaxation time "$T_2$", for instance, when $\tau_1 = 2$ msec (i.e., echo time $T_E = 2\tau_1 = 4$ msec), a strength of an echo signal acquired by the first specific spin echo method of the present invention is attenuated from one point "A" to another point "B" on the Y axis during a time period of "$\tau_1$" (2 msec) in accordance with the relaxation time "$T_2$". To the contrary, as shown in FIG. 6B, when $\tau = 4$ msec (i.e., echo time $T_E = 2\tau_2 = 8$ msec), a strength of an echo signal acquired by the conventional spin echo method is further attenuated from one point "A" via the previous point "B" to another point "C" during a time period of $\tau_2$ (4 msec). As a consequence, the signal to noise (S/N) ratio according to the present invention can be considerably improved, as compared with that of the conventional spin echo method.

For instance, in case of ATP (Adenosin Triphosphate) whose relaxation time "$T_2$" is equal to 15 msec, signal strengths of echo signals acquired by the inventive method and the conventional method, respectively, are considerably different from each other as follows:

Assuming now that the echo time "$T_E$" of the present invention is selected to be 4 msec, and "$T_E$" of the conventional method is selected to be 8 msec, the signal strength "SS" is given by the following equation (1):

$$SS = Ae^{-2\tau/T2} \tag{1}$$

Then, in case of "$T_E$"=4 msec (present invention), $$SS_1 = Ae^{-4msec/15msec} = 0.77 \tag{2}$$

In case of "$T_E$"=8 msec (conventional method), $$SS_2 = Ae^{-8msec/15msec} = 0.59 \tag{3}$$

where symbol "A" is an amplitude of an echo signal and selected to be "1" in this calculation.

As apparent from the above-described equations (2) and (3), assuming now that the noise levels are equal to each other in both of the spin echo methods, the S/N ratio achieved by the first spin echo method of the present invention can be increased by approximately 30% with regard to ATP having $T_E = 15$ msec. Furthermore, since the echo signals are acquired by way of the first spin echo method, no correction is required for the baseline distortion.

Second Specific Spin Echo Method

Figure 9:
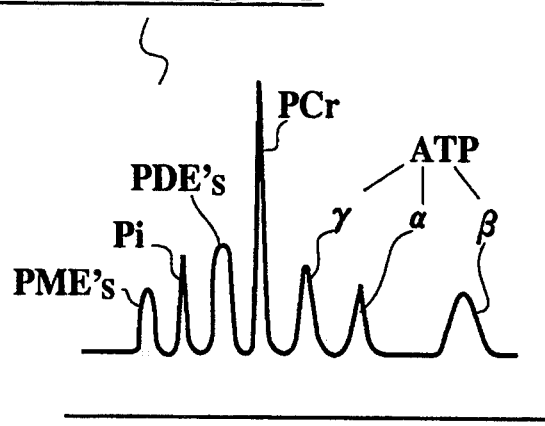
FIG. 9 represents chemical shift data of $^{31}P$ acquired by utilizing the second specific spin echo method of FIG. 7.

Referring now to FIGS. 7 and 9, a second specific spin echo method according to the present invention will be described.

Figure 7C:
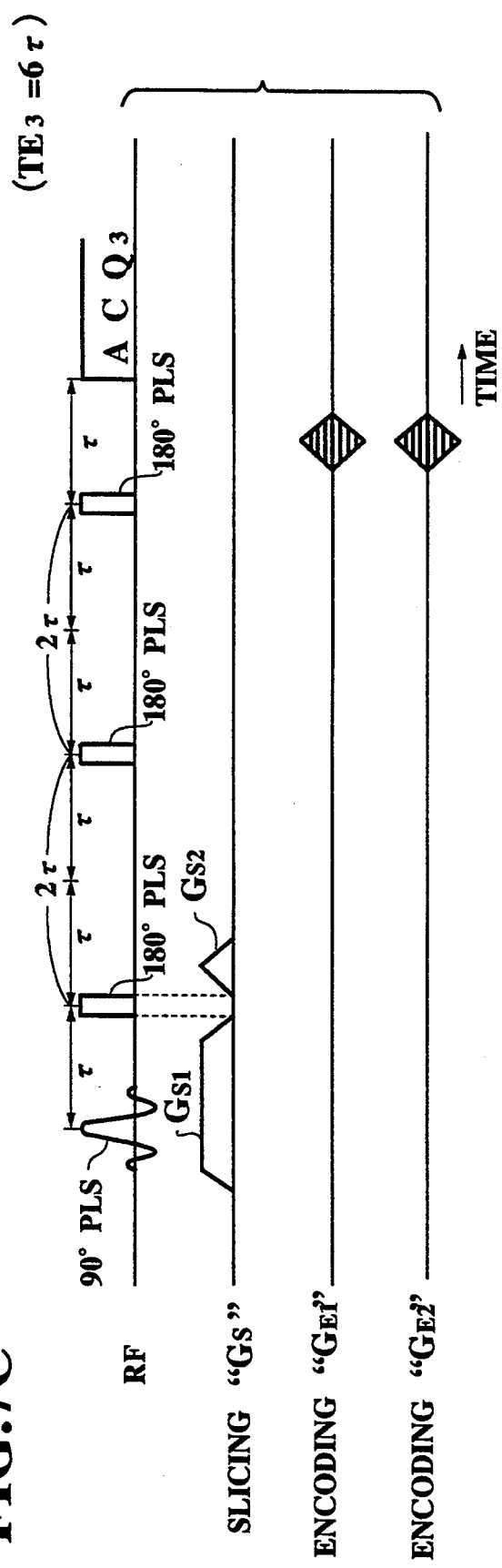

FIGS. 7A to 7C represent a pulse sequence of this second specific spin echo method. This second specific spin echo method is constructed by three sets of pulse sequences. That is, FIG. 7A represents a first pulse sequence which is identical to the pulse sequence of the first specific spin echo method (see FIG. 3). FIG. 7B indicates a second pulse sequence and FIG. 7C denotes a third pulse sequence.

A series of this second specific spin echo method will now be explained, which is similar to the known CPMG (Carr-Purcell-Meiboom-Gill) method except for the application timing of the rephasing gradient field "Gs".

First of all, the first pulse sequence (one 180° pulse application) shown in FIG. 7A is carried out with respect to the biological body 20 in the MR imaging system 100 (see FIG. 1). Since the operation of this first pulse sequence is the same as that of the first specific spin echo method, no further explanation is made in the following description.

After a preselected time period has elapsed, the second pulse sequence (two 180°-pulses application) shown in FIG. 7B is carried out with respect to the same biological body 20. As seen from FIG. 7B, after a first non-selective excitation 180° pulse has been applied to the biological body 20 and the rephasing compensation gradient field $G_{S2}$ is applied thereto, a second non-selective excitation 180° pulse is applied thereto with having a time interval of $2\tau$. Subsequently, after the first and second encoding gradient fields "$G_{E1}$" and "$G_{E2}$" have been applied, the spin echo signals are acquired within the second echo data acquisition period "$ACQ_2$".

Similarly, after a predetermined time period has passed from the second echo data acquisition $ACQ_2$, the third pulse sequence (three 180°-pulses application) shown in FIG. 7C is performed with respect to the same biological body 20. As seen from FIG. 7C, three non-selective excitation 180° pulses are sequentially applied to the biological body 20 with a time interval of "$2\tau$". After applying the third 180° pulse and the encoding gradient fields "$G_{E1}$", "$G_{E2}$" have been applied, the third echo data acquisition period "$ACQ_3$" is commenced.

Figure 8:
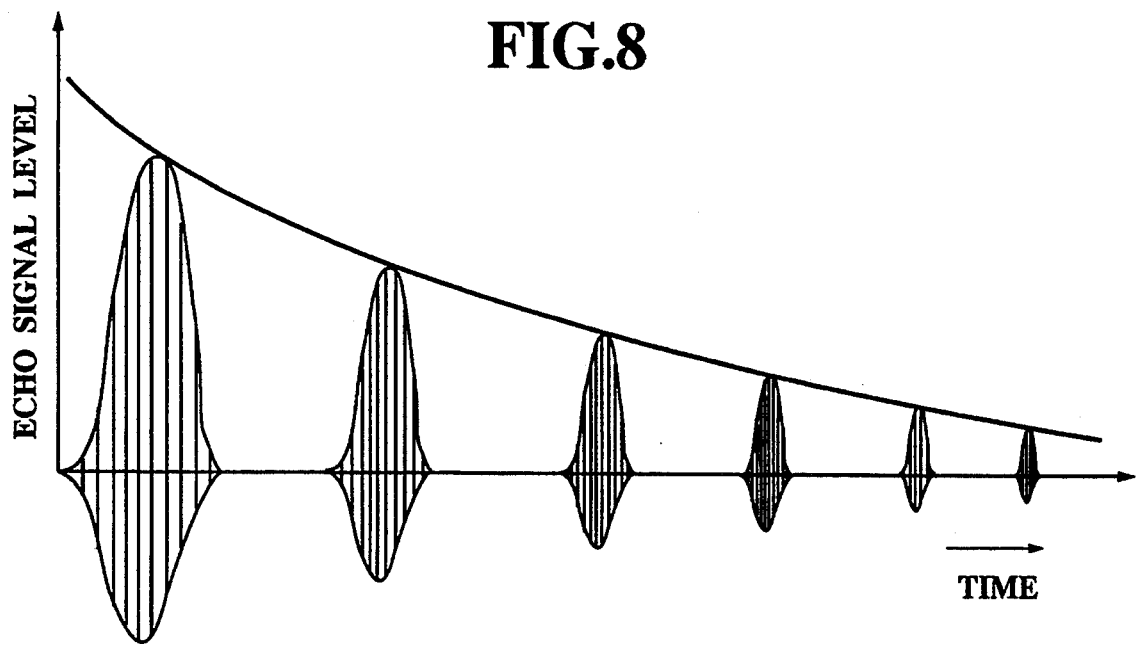
FIG. 8 schematically illustrates a waveform chart for explaining signal levels of echo signals acquired by the second specific spin echo method of FIG. 7.

As previously explained, according to the second specific spin echo method, the echo times $T_{E1}$ to $T_{E3}$ are successively prolonged. The signal strength of the echo signal acquired under the longer echo time, e.g., $T_{E3}$ is attenuated, or lower, as compared with the signal strength of the echo signal acquired under the shorter echo time, e.g., $T_{E1}$, as represented in FIG. 8.

As a consequence, taking account of the above-described signal strength relationship with the echo time $T_E$, $T_2$ values of the respective signal components derived from the biological body 20 can be precisely calculated. Therefore, there is such an advantage that although such shorter $T_2$ values could not be detected by utilizing the long echo time of the conventional spin echo method, these shorter $T_2$ values can be sufficiently detected by employing the second specific spin echo method. For instance, when a chemical shift of phosphorus ($^{31}P$) contained in a brain of the biological body 20 is measured, the second spin echo method is performed in the MR imaging system 100 shown in FIG. 1. Then, as represented in FIG. 9, various components of phosphorus ($^{31}P$) having various short "$T_2$" times, e.g., $\gamma$-ATP, $\alpha$-ATP and $\beta$-ATP can be measured as the chemical shift information (echo pulses) in the computer unit 1 of FIG. 1.

It should be noted that since such a pulse sequence of the second specific spin echo method can be easily produced from the pulse sequencer 2 by utilizing the known computer program, no further explanation thereof is made in the specification. Also, the number of 180° pulses may be arbitrarily varied in accordance with the inventive idea of the second specific spin echo method.

MR Imaging

In the above-described first and second preferred embodiments, the first and second specific spin echo methods have been employed so as to perform spectroscopic imaging. The present invention is not limited to this spectroscopic imaging, but may be applied to MR imaging.

A method to acquire an MR image according to a third specific spin echo method of the present invention will now be summarized with reference to a timing chart of FIG. 10.

As seen from FIGS. 10A and 10B, the RF pulses (90° and 180° pulses) and the slicing gradient field $G_S$ ($G_{S1}$ and $G_{S2}$) are applied to the biological body 20 in a similar manner to that of the first specific spin echo method (see FIGS. 1A and 1B). In accordance with the third specific spin echo method, when the phase encoding gradient field $G_E$ is applied, a reading gradient field $G_R$ is also applied as shown in FIGS. 10C and 10D at the same timing. Such a pulse sequence of the applications of both gradient fields $G_E$ and $G_R$ is repeatedly performed to obtain MR image data.

It should be noted that since all of the echo signals cannot be acquired in accordance with the third specific spin echo method, the following specific process is executed. That is, after the non-selective excitation 180° pulse has been applied to the biological body 20, the reading gradient field $G_R$ is ramped down in a negative direction (i.e., "$-G_R$") and thereafter intersects with a baseline, and furthermore is ramped up toward a positive direction (i.e., "$+G_R$") during a time period "$T_R$" from the end of the 180° pulse to the end of the encoding gradient field $G_E$. As a result, a half or more echo pulses among the entire echo pulse can be successively acquired so that desirable MR images can be obtained in accordance with the third specific spin echo method of the present invention.

What is claimed is:

1. A magnetic resonance (MR) imaging method comprising the steps of:
    applying a slice-selecting gradient field to a biological body under medical examination located in a static field;
    applying a spin excitation pulse to the biological body while said slice-selecting gradient field is being applied thereto;
    applying a refocusing pulse to the biological body after the application of said slice-selecting gradient field;
    applying to the biological body, a rephasing gradient field having the same polarity of that of said slice-selecting gradient field just after the application of said refocusing pulse; and
    acquiring a spin echo signal induced in a slice of the biological body excited by said spin excitation pulse to obtain MR information of said excited slice.

2. An MR imaging method as claimed in claim 1, wherein said refocusing pulse applying step includes the step of:
    applying said refocusing pulse just after the application of said slice-selecting gradient field.

3. An MR imaging method as claimed in claim 1, wherein said refocusing pulse applying step includes the steps of:

applying a first refocusing pulse during a first time interval just after the application of said slice-selecting gradient field; and additionally applying a series of refocusing pulses to the biological body at the substantially same first time interval after the application of the first refocusing pulse; and also said rephasing gradient field applying step includes the step of:

applying said rephasing gradient field just after the application of said series of refocusing pulses has been completed.

4. An MR imaging method as claimed in claim 3, wherein said first time interval between the successive refocusing pulses is about two times longer than a second time interval between said slain excitation pulse and said first refocusing pulse.

5. An MR imaging method as claimed in claim 3, wherein after said rephasing gradient field has been applied to the biological body, the method further includes the step of acquiring chemical shift information about said excited slice by processing said spin echo signal induced in said slice of the biological body excited by said spin excitation pulse.

6. An MR imaging method as claimed in claim 1, further comprising the steps of:

applying a phase-encoding gradient field to said biological body; and applying a signal-reading gradient field to said biological body at the substantially same time when said phase-encoding gradient field is applied in such a manner that a polarity of said signal-reading gradient field is first opposite to that of said rephasing gradient field, and thereafter intersects with a baseline and then is directed toward a positive polarity.

7. A magnetic resonance (MR) imaging system comprising:

first gradient field applying means for applying a slice-selecting gradient field to a biological body under medical examination located in a static field;

first pulse applying means for applying a spin excitation pulse to the biological body while said slice-selecting gradient field is being applied thereto;

second pulse applying means for applying a refocusing pulse to the biological body after the application of said slice-selecting gradient field;

second gradient field applying means for applying to the biological body, a rephasing gradient field having the same polarity of that of said slice-selecting gradient field just after the application of said refocusing pulse; and means for receiving a spin echo signal induced in a slice of the biological body excited by said spin excitation pulse to process MR information of said excited slice.

8. An MR imaging system as claimed in claim 7, wherein said refocusing pulse applying means applies said refocusing pulse just after the application of said slice-selecting gradient field under control of a sequence controller.

9. An MR imaging system as claimed in claim 7, wherein said refocusing pulse applying means is operated under control of a sequence controller to firstly apply a first refocusing pulse during a first time interval, just after the application of said slice-selecting gradient field, and subsequently to apply a series of refocusing pulses to the biological body at the substantially same first time interval after the application of the first refocusing pulse; and said rephasing gradient field applying means applies said rephasing gradient field just after the application of said series of refocusing pulses has been completed.

10. An MR imaging system as claims in claim 9, wherein said first time interval between the successive refocusing pulses is about two times longer than a second time interval between said spin excitation pulse and said first refocusing pulse.

11. An MR imaging system as claimed in claim 9, wherein said receiving means receives said spin echo signal induced in said slice excited by said spin excitation pulse to process chemical shift information of said excited slice.

12. An MR imaging system as claimed in claim 7, further comprising:

third gradient field applying means for applying a phase-encoding gradient field to said biological body; and fourth gradient field applying means for applying a signal-reading gradient field to said biological body at the substantially same time when said phase-encoding gradient field is applied in such a manner that a polarity of said signal-reading gradient field is first opposite to that of said rephasing gradient field, and thereafter intersects with a baseline and then is directed toward a positive polarity.

13. An MR imaging system as claimed in claim 7, wherein said first and second pulse applying means includes a transmitter coil, a spin excitation pulse amplifier connected to the transmitter coil, and a spin excitation pulse transmitter connected to the amplifier.

14. An MR imaging system as claimed in claim 7, wherein said signal receiving means includes a receiver coil, a preamplifier connected to the receiver coil, a receiver connected to the preamplifier, and a computer unit connected to the receiver.

15. An MR imaging system as claimed in claim 7, wherein said first and second gradient field applying means includes three coils, three amplifiers, each one connected to one of the three coils, and three transmitters, each one connected to one of the three amplifiers.

* * * * *